United States Patent
Mousseaux et al.

(10) Patent No.: US 6,549,549 B2
(45) Date of Patent: Apr. 15, 2003

(54) METHOD OF STABILIZING THE WAVELENGTH OF LASERS AND A WAVELENGTH MONITOR

(75) Inventors: Daniel Mousseaux, St-Arnoult-en-Yvelines (FR); Franck Le Gall, Paris (FR)

(73) Assignee: Alcatel, Paris (FR)

( * ) Notice: Subject to any disclaimer, the term of this patent is extended or adjusted under 35 U.S.C. 154(b) by 71 days.

(21) Appl. No.: 09/778,763

(22) Filed: Feb. 8, 2001

(65) Prior Publication Data
US 2002/0009104 A1 Jan. 24, 2002

(30) Foreign Application Priority Data
Feb. 9, 2000 (EP) ............................................. 00440041

(51) Int. Cl.[7] ................................................. H01S 3/13
(52) U.S. Cl. ...................................... 372/32; 372/29.02
(58) Field of Search ........................ 356/416; 359/247; 372/32, 29.011, 29.02

(56) References Cited

U.S. PATENT DOCUMENTS

| 4,583,228 A | 4/1986 | Brown et al. ................. 372/32 |
| 5,798,859 A | 8/1998 | Colbourne et al. ......... 359/247 |

FOREIGN PATENT DOCUMENTS

| DE | 41 19 265 A1 | 12/1992 | ........... H01S/3/103 |
| EP | 0 284 908 A1 | 10/1988 | ........... H01S/3/133 |

Primary Examiner—Quyen Leung
(74) Attorney, Agent, or Firm—Sughrue Mion, PLLC

(57) ABSTRACT

A method of stabilizing the wavelength of lasers comprising a control circuit is proposed, wherein the light of the laser passes through a splitter and the split light passes through a wavelength filter in a first branch, and the light of both branches is in each case received by a photodetector. The photodetector of the first branch can be operated with different gain factors. The wavelength filter has a free spectral region which is greater than the spacing between the individual wavelengths in a wavelength division multiplex.

5 Claims, 2 Drawing Sheets

METHOD OF STABILIZING THE WAVELENGTH OF LASERS AND A WAVELENGTH MONITOR

BACKGROUND OF THE INVENTION

The invention is based on a method of stabilizing the wavelength of lasers and a wavelength monitor for regulating the wavelength of a laser, comprising an optical input, a splitter, a wavelength filter in one branch, and two photodetectors.

Methods of wavelength stabilization are known from the prior art, for example from U.S. Pat. No. 4,583,228. A wave monitor is used in this wavelength stabilization method. Here the light of a laser firstly passes through a beam splitter and strikes a photodetector in each of two branches. One of the two branches contains a Fabry-Perot interferometer. The photocurrents supplied by the two photodiodes are compared in a differential amplifier or divider and supply a resultant error signal required for the control circuit. The wavelength monitor is set at a defined wavelength or group of wavelengths. For this purpose, in one optical branch the Fabry-Perot filter is tuned and in the other optical branch the reference level is set by purposive attenuation of the signal. This known prior art is also described in detail in FIGS. 1 to 3. However, this is an elaborate method and corresponding monitor. Tunable Fabry-Perot filters are mechanically sensitive and cannot be integrated in a module with suitably small structural dimensions.

SUMMARY OF THE INVENTION

The advantage of the method according to the invention is that it is easily possible to adapt the monitor to different wavelengths by regulating one of the two photodiodes and by using a specially dimensioned wavelength filter. In particular in a situation in which the spacings between the wavelengths of a wavelength division multiplex become increasingly smaller, the monitor according to the invention is easily adaptable. Here a wavelength filter is used which is not tunable and thus has reduced sensitivity in respect of mechanical problems.

BRIEF DESCRIPTION OF THE DRAWINGS

Exemplary embodiments of the invention are illustrated in the drawing and explained in detail in the following description. In the drawing.

DETAILED DESCRIPTION OF THE INVENTION

Figure 1:
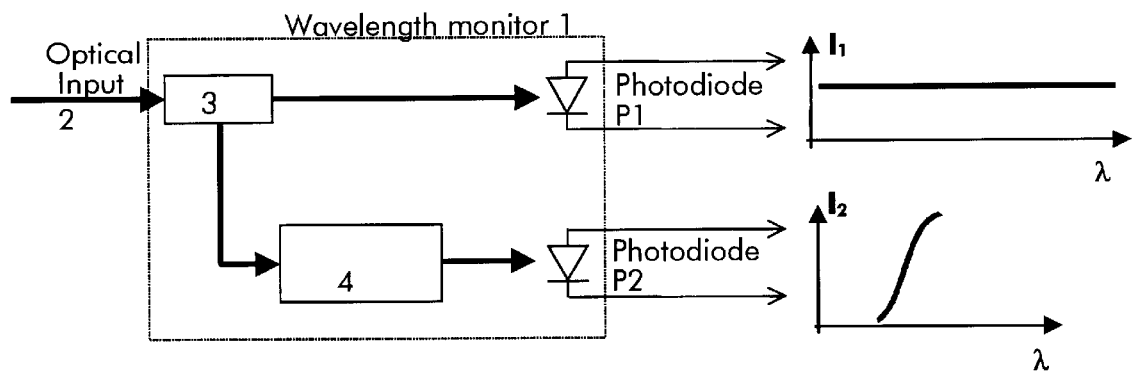
FIG. 1 illustrates a wavelength monitor according to the prior art.
Figure 2:
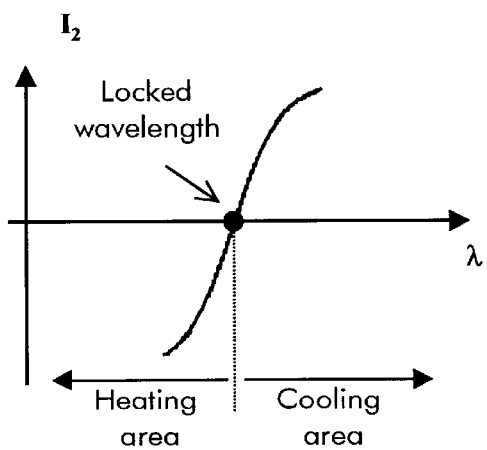
FIG. 2 illustrates the difference signal of a wavelength monitor.
Figure 3:
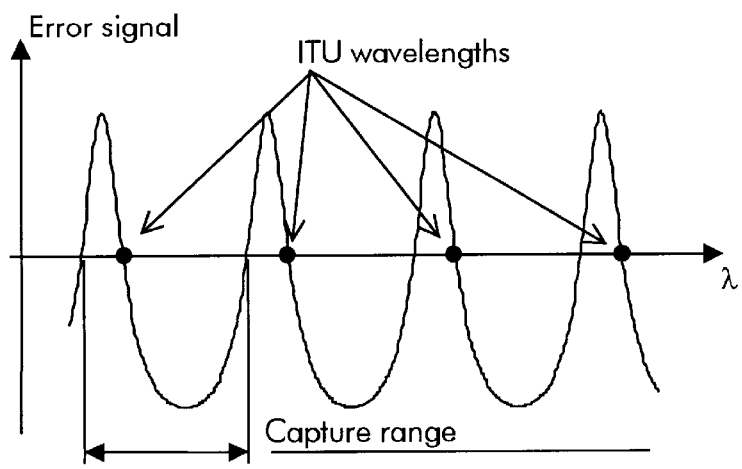
FIG. 3 illustrates the error signal of a monitor according to the prior art.

A wavelength monitor 1 is schematically illustrated in FIG. 1. A beam splitter 3 is connected to an optical input 2. The beam splitter 3 splits the light into two branches. The first output of the beam splitter 3 leads directly to a photodiode P1. The second optical output of the beam splitter 3 leads to the input of a wavelength filter 4, whose optical output leads to a photodiode P2. The photodiodes, the electrical connections of which have not been shown here, supply photocurrents. The photodiode P1 supplies a constant reference current I1 relative to changes in the wavelength of the laser whose light is applied to the optical input 2. As a result of the wavelength filter, the photo diode P2 supplies a filter function 12 in dependence upon the wavelength. The two photocurrents are analyzed in respect of their difference or ratio and supply a function illustrated in FIG. 2. The intersection point of these functions is set at the desired wavelength via the choice of filter and/or via the photodiodes gain. It is indicated in FIG. 2 that the wavelength of the laser can be adjusted by heating or cooling of the laser, whereby an intersection point not yet at the exact wavelength can be shifted. The reference current $I_1$ must supply a value such that the error signal becomes zero at the desired wavelength to be set or the ratio between the photodiodes currents reach the target value. The error signal is then used to operate the laser temperature control stage. If the wavelength drifts towards small wavelengths, the control circuit compensates for this by heating the laser. If the wavelength drifts towards a larger wavelength, the control circuit cools the laser. When a wavelength monitor of this kind is used for wavelength division multiplex transmission systems, it is effective to select wavelength filters with a periodic characteristic. It is known to user Fabry-Perot filters here. In the simplest case one uses, for example, fibre Fabry-Perot interferometers with an air gap as dispersive element. Due to the use of Fabry-Perot interferometers, the period of the interferometer can be selected to correspond to the wavelength pattern for the wavelength division multiplex. The error curve in the case of the use of such a periodic filter is illustrated in FIG. 3. Here the error signal of a periodic wavelength filter is plotted over the wavelength. It can be seen that, due to the periodic function, the value "zero" always occurs at the intersection point between reference signal and filter function, whereby the desired wavelengths can be set in the spacing of the free spectral region of the function. In this way it is possible to set a laser at different wavelengths. This reduces the number of different lasers to be used by an operator of a wavelength division multiplex transmission system. In accordance with the stipulations of the International Telecommunication Union (ITU), the accuracy with which the wavelengths are set here must amount to one tenth of the channel spacing between the wavelengths. Thus high accuracy levels are to be expected with channel spacings of 200 GHz. However, WDM systems with substantially smaller channel spacings are planned for the future, which will increase the demands on the wavelength monitors and control circuits. If one refers to the method of wavelength stabilization illustrated in FIG. 3, it will be seen that when the channel spacing between the individual wavelengths is reduced, it is necessary to adapt the period of the Fabry-Perot interferometer. Therefore the free spectral region (FSR) must be reduced. The free spectral region of a Fabry-Perot interferometer with an air gap is defined as $$FSR = \frac{c}{2 \cdot n \cdot l} \quad \text{assuming vertically impinging light rays.}$$

Here c is the light velocity, n is the refractive index of the air and l is the size of the air gap. If the free spectral region is now to be reduced, the size of the air gap l must simultaneously increase. Such an increase in size of the Fabry-Perot interferometer counters the endeavoured use of highly integrated, small systems.

Furthermore, the range in which the wavelength can be set is approximately governed by the spacing between the channels. Therefore in the case of channels with small channel spacings, it is of greater importance to have a linear control range so that the temperature stabilization can take place over the entire life of a laser. The small linear range of the signal of the photodiode P2 is also disadvantageous in terms of positioning tolerances in the mechanical alignment of the interferometer.

Figure 4:
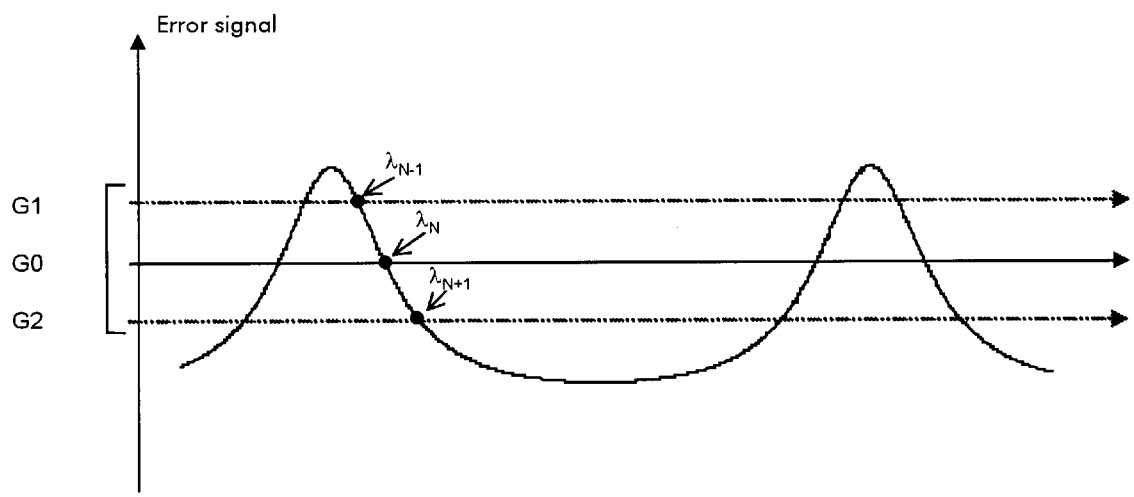
FIG. 4 illustrates the error signal of a wavelength monitor according to the invention and FIG. 5 schematically illustrates the construction of a wavelength monitor according to the invention.

FIG. 4 thus shows the results of the use of the method according to the invention. Instead of reducing the free spectral region of the interferometer, the free spectral region is distinctly increased and at the same time the gain of the reference signal of the photodiode P2 is varied. It is thus possible to arrange different wavelengths of the wavelength division multiplex on one edge of the periodic error signal. By adapting the electric gain of the photodiode P1 it is possible to set any wavelength in the linear range between the gain regions G1 and G2. This method according to the invention has the advantage that a high degree of integration can be achieved by reducing the air gap of the interferometer. The range in which a wavelength can be set is increased. The linear range is also expanded so that the problems associated with the mechanical positioning of the interferometer are reduced. The method can be easily adapted to different wavelength division multiplex channel spacings, for example of 100 GHz, 50 GHz or even 25 GHz.

Figure 5:
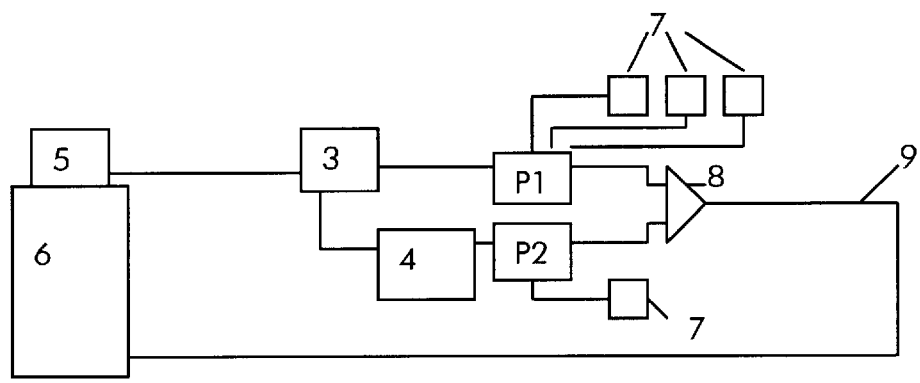

FIG. 5 schematically illustrates the construction of a monitor according to the invention. A laser 5 is connected to a temperature control stage 6. The light of the laser 5 is applied to the input end of a splitter 3. The light of the splitter 3 passes on the one hand to a photodiode P1 and on the other hand via the wavelength filter to the photodiode P2. The photodiode currents are analyzed in a differential amplifier 8, whose error signal 9 is applied to the temperature control stage 6. The photodiodes are each operated by drivers 7, the other electrical circuits having not been shown. While a constant driver voltage is available in the optical branch of the photodiode P2, different driver voltages can be used, as indicated in the optical branch of the photodiode P1. In this way the photocurrent of the photodiode P1 is influenced and the gain is controlled.

In another embodiment the photodiode P1 can be operated by a driver which internally supplies different drive voltages.

What is claimed is:

1. A method of stabilizing the wavelength of lasers (5) comprising a control circuit which regulates the wavelength of the laser, wherein the light of the laser passes through a splitter (3), and the split light passes through a non-tunable wavelength filter (4) in a first branch, the light of both branches is in each case received by a photodetector (P1, P2), one of the photodetectors is operated with at least two gain factors, the non-tunable wavelength filter (4) has a nearly linear region which is greater than the spacing between individual wavelengths in a wavelength division multiplex, the combined signals of the two photodetectors serve as an error signal for regulating the temperature of the laser, and said one photodetector is driven at different voltages to vary the gain of said one photodetector.

2. A wavelength monitor (1) for regulating the wavelength of a laser (5) comprising an optical input (2), a splitter (3), a non-tunable wavelength filter (4) in one branch, and two photodetectors (P1, P2), characterised in that one of the photodiodes can be operated with at least two gain factors, the wavelength filter (4) has a free spectral region which is greater than the spacing between the wavelengths in a wavelength division multiplex, and at least two voltage drivers are provided for varying the gain of said one photodiode.

3. A monitor according to claim 2, characterised in that the wavelength filter is a Fabry-Perot filter.

4. A monitor according to claim 2, characterised in that the wavelength filter is a Mach-Zehnder interferometer or thin-film interference filter.

5. A monitor according to claim 2 for use in a control circuit for setting a laser wavelength over the temperature and/or over the injection current of the laser.

* * * * *